(12) United States Patent
Shim et al.

(10) Patent No.: US 9,230,621 B2
(45) Date of Patent: Jan. 5, 2016

(54) SEMICONDUCTOR MEMORY DEVICE WITH SIGNAL RESHAPING AND METHOD OF OPERATING THE SAME

(71) Applicant: SAMSUNG ELECTRONICS CO., LTD., Suwon-si (KR)

(72) Inventors: Yong Shim, Suwon-si (KR); In-Dal Song, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 14/197,883

(22) Filed: Mar. 5, 2014

(65) Prior Publication Data

US 2014/0258607 A1 Sep. 11, 2014

Related U.S. Application Data

(60) Provisional application No. 61/772,633, filed on Mar. 5, 2013.

(30) Foreign Application Priority Data

May 29, 2013 (KR) ........................ 10-2013-0061057

(51) Int. Cl.
*G06F 13/12* (2006.01)
*G06F 12/00* (2006.01)
*G11C 7/10* (2006.01)
*G11C 7/22* (2006.01)
*G11C 11/4076* (2006.01)

(52) U.S. Cl.
CPC .............. *G11C 7/1072* (2013.01); *G11C 7/222* (2013.01); *G11C 7/225* (2013.01); *G11C 11/4076* (2013.01)

(58) Field of Classification Search
None
See application file for complete search history.

(56) References Cited

U.S. PATENT DOCUMENTS

| | | | |
|---|---|---|---|
| 6,532,180 B2 | 3/2003 | Ryan et al. | |
| 6,762,962 B2 | 7/2004 | Nagashima | |
| 7,224,625 B2 | 5/2007 | Dietrich et al. | |
| 7,443,762 B2 | 10/2008 | Dietrich | |
| 7,826,281 B2* | 11/2010 | Nakashima | 365/189.15 |
| 7,843,763 B2* | 11/2010 | Lee | 365/233.1 |
| 7,995,406 B2 | 8/2011 | Lee | |
| 8,432,754 B2* | 4/2013 | Iwasaki | 365/193 |
| 2001/0012234 A1 | 8/2001 | Keeth et al. | |
| 2007/0076493 A1 | 4/2007 | Ha et al. | |

FOREIGN PATENT DOCUMENTS

JP 2009-093769 A 4/2009

* cited by examiner

*Primary Examiner* — Idriss N Alrobaye
*Assistant Examiner* — Richard B Franklin
(74) *Attorney, Agent, or Firm* — Sughrue Mion, PLLC

(57) ABSTRACT

A semiconductor memory device and a method of operating the same are provided. The semiconductor memory device includes a buffer that inputs a first signal and outputs a first delay signal, a command decoder that outputs a second signal, a mask pulse signal generator that inputs the first delay signal and the second signal and generates a mask pulse signal, and a signal reshaper that inputs the first delay signal, the second signal and the mask pulse signal and reshapes the first delay signal or the second signal.

17 Claims, 12 Drawing Sheets

SEMICONDUCTOR MEMORY DEVICE WITH SIGNAL RESHAPING AND METHOD OF OPERATING THE SAME

CROSS-REFERENCE TO RELATED APPLICATION

This application is based on and claims priority from U.S. Patent Application No. 61/772,633, filed on Mar. 5, 2013 in the U.S. Patent and Trademark Office, and Korean Patent Application No. 10-2013-0061057 filed on May 29, 2013 in the Korean Intellectual Property Office, and all the benefits accruing therefrom under 35 U.S.C. 119, the contents of which are incorporated herein by reference, in their entirety.

BACKGROUND

1. Field

The exemplary embodiments relate to a semiconductor memory device and a method of operating the same.

2. Description of the Related Art

Synchronous semiconductor memory devices operate in synchronization with an external system clock to improve operating speeds.

Among the synchronous semiconductor memory devices, a synchronous DRAM (SDRAM) may input/output one piece of data during one cycle of a clock in synchronization with a rising edge of the clock. By contrast, a double data rate SDRAM (DDR SDRAM) is configured to input/output data in synchronization not only with a rising edge of the clock but also a falling edge of the clock. Therefore, the DDR SDRAM may continuously input/output two pieces of data during one cycle of a clock. That is to say, the DDR SDRAM can implement an operating speed of greater than two times without increasing the frequency of the clock, compared to a conventional SDRAM.

During a read operation, the semiconductor memory device may output to an external device a data strobe signal (DQS) that is a kind of an echo clock signal with data. The reason of the foregoing is to allow the semiconductor memory device to notify a CPU or a controller of accurate timings of output data and to minimize a time skew generated between chips in a memory chipset. The data strobe signal DQS is basically maintained at a high state of impedance (Hi-Z) and makes a transition to a low clock when at one clock prior to the data being output. Accordingly, an external device is notified that data is to be output, prior to the output, thereby allowing the external device to accurately receive the data. Thereafter, the data strobe signal DQS is repeatedly toggled between a high level and a low level, and data is output while the data strobe signal DQS is toggled. The data strobe signal DQS is then maintained at a low level during half a clock during which the last data is output in order to notify the external device that the output of data is completed, and goes back to the Hi-Z state.

A period in which the data strobe signal DQS is maintained at a low level for one clock period prior to data being output is referred to as a preamble, and a period in which the data strobe signal DQS is maintained at a low level for half a clock period prior to the last data being output is referred to as a postamble. That is to say, the data strobe signal DQS notifies an external device of a data output timing start and a data output timing end using the preamble and the postamble. The external device determines a precise timing for receiving data using the preamble of the data strobe signal DQS applied earlier than the data.

SUMMARY

The exemplary embodiments provide a semiconductor memory device which can generate a proper write flag to fetch data at a correct timing.

The exemplary embodiments also provide a method of operating a semiconductor memory device, which can generate a proper write flag to fetch data at a correct timing.

These and other objects of the will be described in or be apparent from the exemplary embodiments.

According to an aspect of the exemplary embodiments, there is provided a semiconductor memory device including a buffer configured to input a first signal and output a first delay signal, a command decoder configured to output a second signal, a mask pulse signal generator configured to input the first delay signal and the second signal and generate a mask pulse signal, and a signal reshaper configured to input the first delay signal, the second signal and the mask pulse signal and reshapes the first delay signal or the second signal.

According to another aspect of the exemplary embodiments, a method of operating a semiconductor memory device is provided, the method including receiving a first signal and outputting a first delay signal; outputting a second signal; generating a mask pulse signal using the first delay signal and the second signal; and receiving the first delay signal, the second signal, and the mask pulse signal and reshaping the first delay signal or the second signal.

An aspect of the exemplary embodiments may further provide a semiconductor memory device including: a mask pulse signal generator configured to receive a first delay signal and a second signal and generate a mask pulse signal; and a signal reshaper configured to receive the first delay signal, the second signal and the mask pulse signal and reshape the first delay signal or the second signal.

The reshaper may be configured to reshape the first delay signal and the second signal. The semiconductor memory device may further include a buffer configured to input a first signal and outputs the first delay signal to the mask pulse signal generator.

The buffer may be configured to output the first delay signal to the signal reshaper. The semiconductor memory device may further include a command decoder configured to output the second signal to the mask pulse signal generator.

The first signal may include a data strobe signal for reading a data signal at a constant interval, and the second signal includes an internal write command signal for performing a write operation.

The mask pulse signal generator may be further configured to input at least one of a first information signal which includes information related to a preamble length of the first signal and a second information signal.

The reshaping of the first delay signal by the mask pulse signal generator may include reshaping the first delay signal by combining the first delay signal and the mask pulse signal to prevent the first delay signal from toggling.

In addition, the reshaping of the second signal may include reshaping the second signal by combining the second signal and the mask pulse signal to disable the second signal.

BRIEF DESCRIPTION OF THE DRAWINGS

The above and other features and advantages will become more apparent by describing in detail exemplary embodiments thereof with reference to the attached drawings in which.

DETAILED DESCRIPTION OF THE EXEMPLARY EMBODIMENTS

Figure 1A:
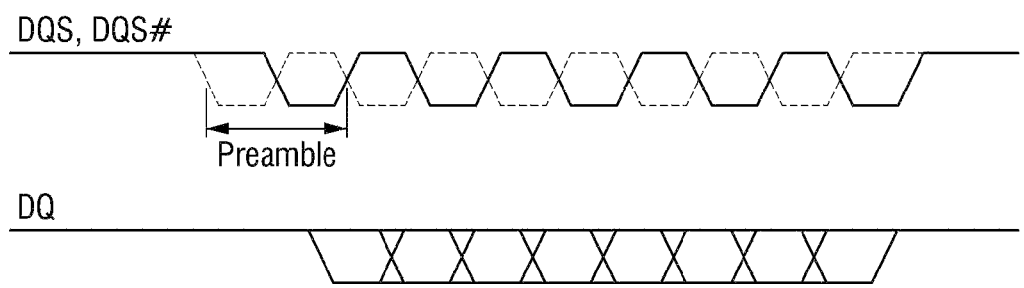
FIG. 1A illustrates a 1tCK write preamble mode of a data strobe signal and FIG. 1B illustrates a 2tCK write preamble mode of a data strobe signal.

The exemplary embodiments will now be described more fully hereinafter with reference to the accompanying drawings. the exemplary embodiments may, however, be embodied in different forms and should not be construed as limited to the exemplary embodiments set forth herein. Rather, these exemplary embodiments are provided so that this disclosure will be thorough and complete, and will fully convey the scope of the exemplary embodiments to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which exemplary embodiments belong. It is noted that the use of any and all examples, or exemplary terms provided herein is intended merely to better illuminate the exemplary embodiments and are not a limitation related to the scope of the invention unless otherwise specified. Further, unless defined otherwise, all terms defined in generally used dictionaries may not be overly interpreted.

The exemplary embodiments will be described with reference to perspective views, cross-sectional views, and/or plan views, in which preferred embodiments are shown. Thus, the profile of an exemplary view may be modified according to manufacturing techniques and/or allowances. That is, the exemplary embodiments are not intended to limit the scope but rather are provided to cover all changes and modifications that can be caused due to a change in manufacturing process. Thus, regions shown in the drawings are illustrated in schematic form and the shapes of the regions are presented simply by way of illustration and not as a limitation The semiconductor memory device and the method of operating the same will be described below with regard to a data write operation adopted in a DDR4 SDRAM. That is to say, the semiconductor memory device and the method of operating the same according to the exemplary embodiments concern reshaping a data strobe signal DQS or an internal write command signal in order to avoid a write fail when the DDR4 SDRAM determines a timing for generating a write flag in a 2tCK write preamble mode. The data strobe signal DQS used in the DDR SDRAM may have a preamble and a postamble. A 2tCK write preamble mode may be employed to the data strobe signal DQS of the DDR4 SDRAM. The semiconductor memory device and the method of operating the same according to the exemplary embodiments may adopt the 2tCK write preamble mode.

The write preamble mode of the write strobe signal DQS used in the DDR4 SDRAM will now be described.

Figure 1B:
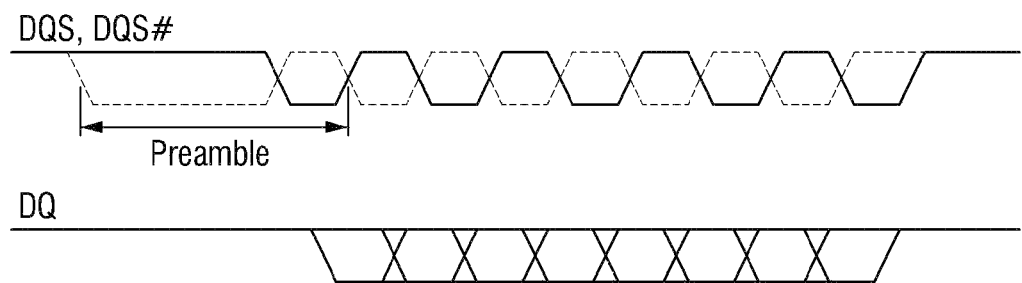
Figure 2:
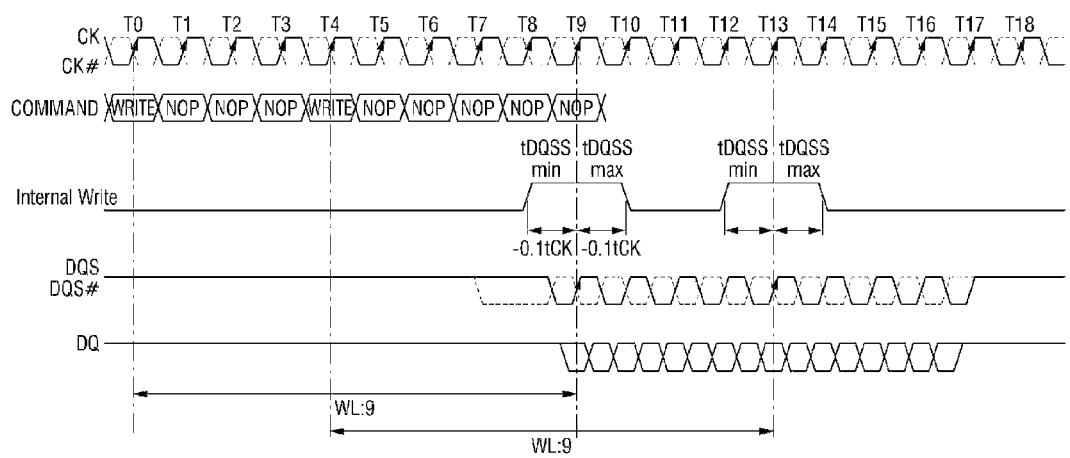
FIG. 2 illustrates a tDQSS margin in a 2tCK write preamble mode.
Figure 3A:
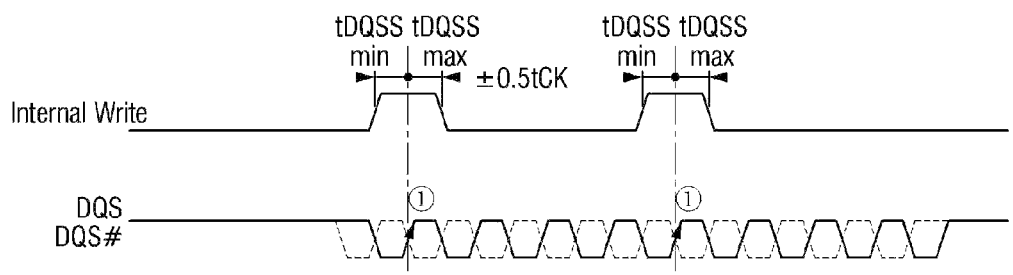
FIG. 3A illustrates a write operation in a 1tCK write preamble mode and FIG. 3B illustrates a write operation in a 2tCK write preamble mode.
Figure 3B:
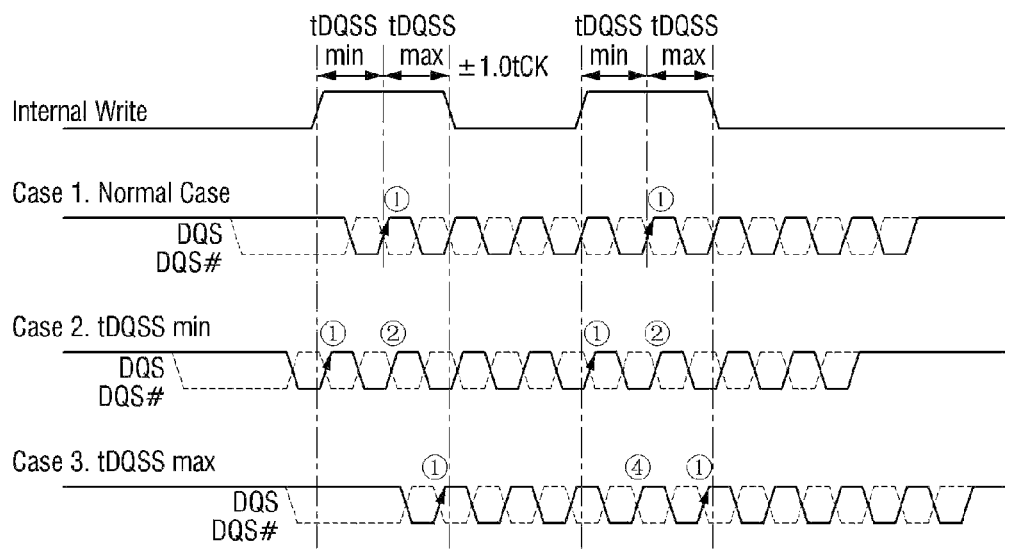

FIG. 1A illustrates a 1tCK write preamble mode of a data strobe signal and FIG. 1B illustrates a 2tCK write preamble mode of a data strobe signal, FIG. 2 illustrates a tDQSS margin in a 2tCK write preamble mode, and FIG. 3A illustrates a write operation in a 1tCK write preamble mode and FIG. 3B illustrates a write operation in a 2tCK write preamble mode.

Referring to FIGS. 1A and 1B, the preamble clock period is doubled in a 2tCK write preamble mode, compared to in a 1tCK write preamble mode. When operating at a high frequency, a tDQSS margin can be increased by employing the 2tCK write preamble mode. That is to say, the DDR4 SDRAM basically employs the 1tCK write preamble mode. However, when the DDR4 SDRAM operates at a high frequency, it employs the 2tCK write preamble mode.

Referring to FIG. 2, when a write command is externally applied at timing TO, an internal write command is generated after a write latency (WL) (e.g., 9tCK of FIG. 2). The internal write command is fetched to the first rising edge of the data strobe signal DQS to generate a first write flag. The tDQSS margin means a delay adjustment range of the data strobe signal DQS, within which an input internal command can be executed without fail. That is to say, the first rising edge of the data strobe signal DQS should exist within the pulse width of the internal write command signal after the internal write command signal is generated. Here, a width range in which the first rising edge of the data strobe signal DQS may exist corresponding to the tDQSS margin.

In the 2tCK write preamble mode, the internal write command signal having a 2tCK margin is generated. Referring to FIG. 2, the internal write command signal has a tDQSS minimum (min) value of −1.0tCK and a tDQSS maximum (max) value of +1.0tCK, the tDQSS margin of the internal write command signal is 2tCK. When a write operation is performed at a high frequency, the tDQSS margin is wider in the 2tCK write preamble mode than in the 1tCK write preamble mode.

Referring to FIG. 3A, in the 1tCK write preamble mode, a margin between the internal write command signal and the data strobe signal DQS is illustrated in a timing diagram. The first rising edge of the data strobe signal DQS fetches the internal write command signal. Even when the data strobe signal DQS is moved within the range from the tDQSS min value to the tDQSS max value, only the first rising edge of the data strobe signal DQS fetches the internal write command signal.

Referring to FIG. 3B, in the 2tCK write preamble mode, a margin between the internal write command signal and the data strobe signal DQS is illustrated in a timing diagram. Here, not only the first rising edge of the data strobe signal DQS but also other rising edges may fetch the internal write command signal. That is to say, when the first rising edge of the data strobe signal DQS is moved at a timing which corresponds to the tDQSS min value, not only the first rising edge of the data strobe signal DQS but also the second rising edge of the data strobe signal DQS may fetch the internal write command signal (Case 2). In addition, when the first rising edge of the data strobe signal DQS is moved at a timing which corresponds to the tDQSS max value, in gapless write operations that are continuously performed, the fourth rising edge of the data strobe signal DQS to have been used in the previous write operation may fetch the internal write command signal required for the next write operation (Case 3).

As described above, in a case where the data strobe signal DQS is moved within the tDQSS margin in the tCK write preamble mode, if a rising edge other than the first rising edge of the data strobe signal DQS fetches the internal write command signal, wrong data may be written in generating a write flag, resulting in a write fail, which may be problematic in achieving an improved tDQSS margin using the 2tCK write preamble mode.

Figure 4:
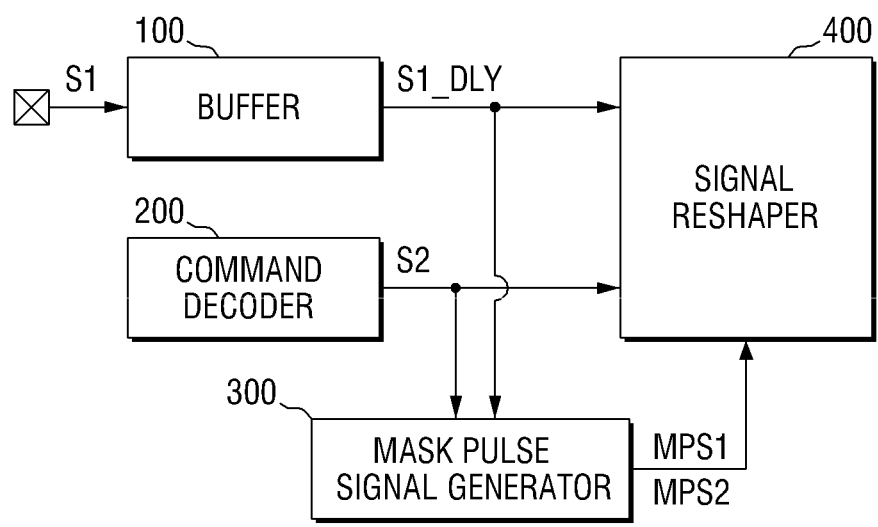
FIG. 4 is a block diagram schematically illustrating a semiconductor memory device according to an exemplary embodiment.
Figure 5:
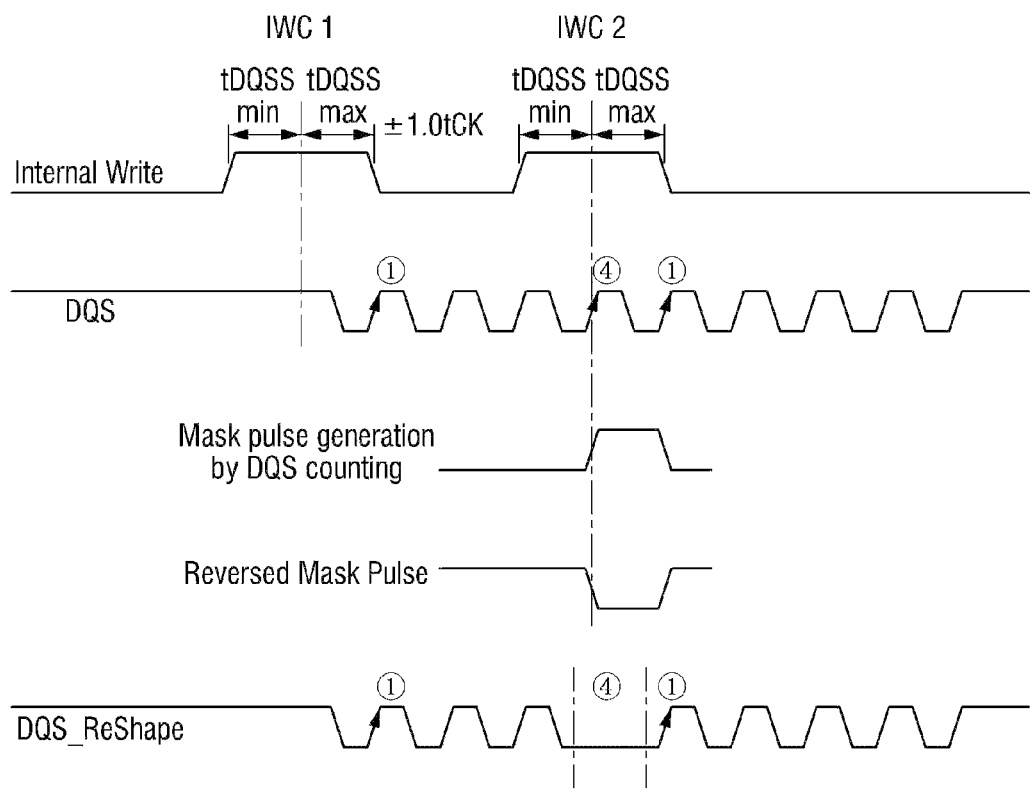
FIG. 5 illustrates a mask pulse signal is generated to reshape a data strobe signal.

FIG. 4 is a block diagram schematically illustrating a semiconductor memory device according to an exemplary embodiment and FIG. 5 illustrates a mask pulse signal is generated to reshape a data strobe signal.

Referring to FIG. 4, the semiconductor memory device according to an exemplary embodiment includes a buffer 100, a command decoder 200, a mask pulse signal generator 300, and a signal reshaper 400.

The buffer 100 receives a first signal S1 and outputs a first delay signal S1_DLY. The first signal S1 may include a data strobe signal DQS for reading data signals at a constant interval, or a clock signal. The buffer 100 may receive the first signal S1, may amplify the first signal S1 and may then output the first delay signal S1_DLY.

The command decoder 200 outputs a second signal S2. The second signal S2 may include an internal write command signal for performing a write operation, or may be a data signal.

The mask pulse signal generator 300 receives the first delay signal S1_DLY and the second signal S2 and generates mask pulse signals (e.g., MPS1 and MPS2). The internal operation of the mask pulse signal generator 300 will be described with reference to FIGS. 4 and 5. The mask pulse signal generator 300 receives the first delay signal S1_DLY and the second signal S2. For example, the first delay signal S1_DLY may be a data strobe signal DQS and the second signal S2 may be an internal write command signal.

The operation of generating the mask pulse signal MPS1 which is capable of removing unnecessary rising edges of the data strobe signal DQS will be described with reference to FIG. 5. FIG. 5 illustrates a case in which the first rising edge of the data strobe signal DQS is moved with a timing which corresponds to the tDQSS max value of the internal write command signal IWC1. In this case, in a gapless write operation in which write operations are successively performed, the fourth rising edge to have been used in the previous write operation may fetch the internal write command signal IWC2 required in the next write operation.

Therefore, in order to prevent the fourth rising edge of the data strobe signal DQS from fetching the internal write command signal IWC2 required in the next write operation, a pulse including the fourth rising edge of the data strobe signal DQS should be made into a low level. To this end, the mask pulse signal MPS1 for allowing the pulse including the fourth rising edge of the data strobe signal DQS to be made into a low level may be generated using information related to the number of pulses of the data strobe signal DQS.

Conversely, in successively performed write operations, the mask pulse signal generator 300 may generate the mask pulse signal MPS2 for allowing a pulse of the internal write command signal IWC2 to be used in the next write operation, instead of the internal write command signal IWC1 used in the previous write operation, to be made into a low level, or may generate the plurality of mask pulse signals (e.g., MPS1 and MPS2).

The signal reshaper 400 may receive a first delay signal S1_DLY, a second signal S2 and a mask pulse signal (e.g., MPS1 or MPS2) and may reshape the first delay signal S1_DLY or the second signal S2. The first delay signal S1_DLY may be a data strobe signal DQS and the second signal S2 may be an internal write command signal. The signal reshaper 400 may reshape the first delay signal S1_DLY to prevent the first delay signal S1_DLY from toggling or to disable the second signal S2. That is to say, the signal reshaper 400 may receive the mask pulse signal (e.g., MPS1 or MPS2) generated from the mask pulse signal generator 300 and may reshape the first delay signal S1_DLY or the second signal S2 using the mask pulse signal (e.g., MPS1 or MPS2).

The internal operation of the signal reshaper 400 will now be described with reference to FIGS. 4 and 5.

The signal reshaper 400 receives the first delay signal S1_DLY, the second signal S2, and the mask pulse signal (e.g., MPS1 or MPS2). The signal reshaper 400 may reshape the first delay signal S1_DLY, or the second signal S2. Alternatively, signal reshaper 400 may also reshape the first delay signal S1_DLY and the second signal S2.

A case of reshaping the first delay signal S1_DLY will first be described. Assuming that the first delay signal S1_DLY is a data strobe signal DQS. If the signal reshaper 400 receives the mask pulse signal MPS1, the mask pulse signal MPS1 is inverted to combine the mask pulse signal MPS1 and the data strobe signal DQS to allow the pulse including the fourth rising edge of the data strobe signal DQS to be made into a low level (see FIG. 5). Accordingly, the signal reshaper 400 may reshape the data strobe signal DQS to prevent the data strobe signal DQS from toggling.

Although not shown in FIG. 5, a case of reshaping the second signal S2 will now be described. Here, it is assumed that the second signal S2 is an internal write command signal. If the signal reshaper 400 receives the mask pulse signal MPS2 from the mask pulse signal generator 300, the mask pulse signal MPS2 is inverted to combine the mask pulse signal MPS2 and the internal write command signal IWC2. Accordingly, in the successively performed write operations, the pulse of the internal write command signal IWC2 to be used in the next write operation, instead of the internal write command signal IWC1 used in the previous write operation, is made into a low level. Accordingly, the signal reshaper 400 may reshape the internal write command signal IWC2 to disable the internal write command signal IWC2.

In addition, the signal reshaper 400 may receive the plurality of mask pulse signals (e.g., MPS1 and MPS2) from the mask pulse signal generator 300, may invert the same and may combine the data strobe signal DQS and the internal write command signal.

Accordingly, the signal reshaper 400 may reshape the pulse including the unnecessary rising edges of the data strobe signal DQS to be made into a low level in order to prevent the data strobe signal DQS from toggling. In addition, the pulse of the internal write command signal IWC2 to be used in the next write operation, instead of the internal write command signal IWC1 used in the previous write operation, is made into a low level, thereby reshaping the internal write command signal IWC2 to disable the internal write command signal IWC2.

Figure 6:
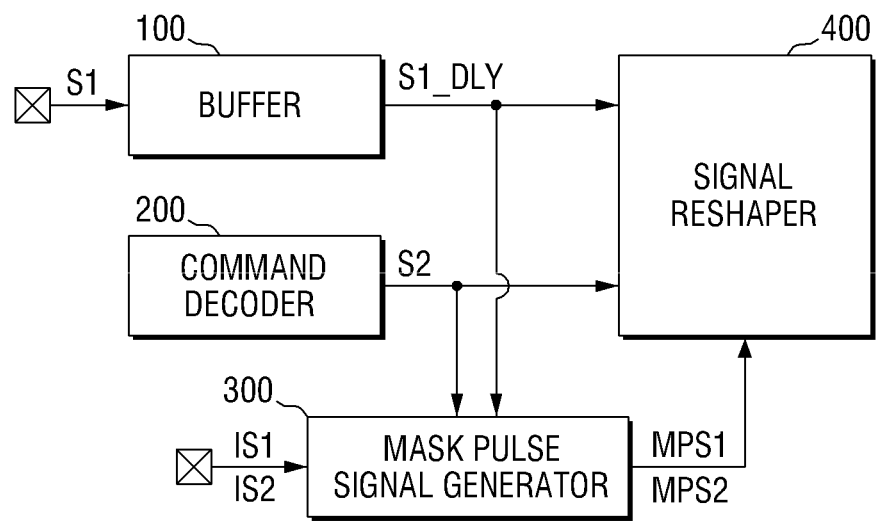
FIG. 6 is a block diagram schematically illustrating a semiconductor memory device according to another exemplary embodiment.

FIG. 6 is a block diagram which schematically illustrates a semiconductor memory device according to another exemplary embodiment. For the sake of convenient explanation, the same portions as those of the semiconductor memory device according to the previous exemplary embodiment will be omitted.

Referring to FIG. 6, in the semiconductor memory device according to another exemplary embodiment, a mask pulse signal generator 300 may further receive at least one of a first information signal IS1 and a second information signal IS2.

The first information signal IS1 may include information related to a preamble length of the first signal IS1, and the second information signal IS2 may include information related to mask pulse signals (e.g., MPS1 and MPS2). For example, the first information signal IS1 may be a preamble information signal and the second information signal IS2 may be at least one of a cyclic redundancy check (CRC) information signal and a burst length information signal.

The preamble information signal is a signal containing information for determining whether a write preamble mode is a 1tCK write preamble mode or a 2tCK write preamble mode. As described above, the 1tCK write preamble mode is basically used in the DDR4 SDRAM, and the 2tCK write preamble mode is used at a high frequency. Since the mask pulse signal (e.g., MPS1 or MPS2) is required when a current operation state is in a 2tCK write preamble mode, it is necessary to determine whether the current operation state is in a 1tCK write preamble mode or a 2tCK write preamble mode.

When the current operation state is in the 2tCK write preamble mode, the mask pulse signal generator 300 may generate the mask pulse signals (e.g., MPS1 and MPS2).

The cyclic redundancy check (CRC) information signal is a signal having information for determining whether the current operation includes a CRC operation. If the current operation includes the CRC operation, the number of bits of series data is changed from 8 to 10 and generating positions of the mask pulse signals (e.g., MPS1 and MPS2) should be changed.

The burst length information signal is a signal having information about burst lengths of input data, and the number of data returning in response to a request may vary according to the burst length. Accordingly, the generating positions of the mask pulse signals (e.g., MPS1 and MPS2) should be changed according to the burst length.

The mask pulse signal generator 300 may generate the mask pulse signals (e.g., MPS1 and MPS2) using the preamble information signal, the CRC information signal, or the burst length information signal.

Figure 7:
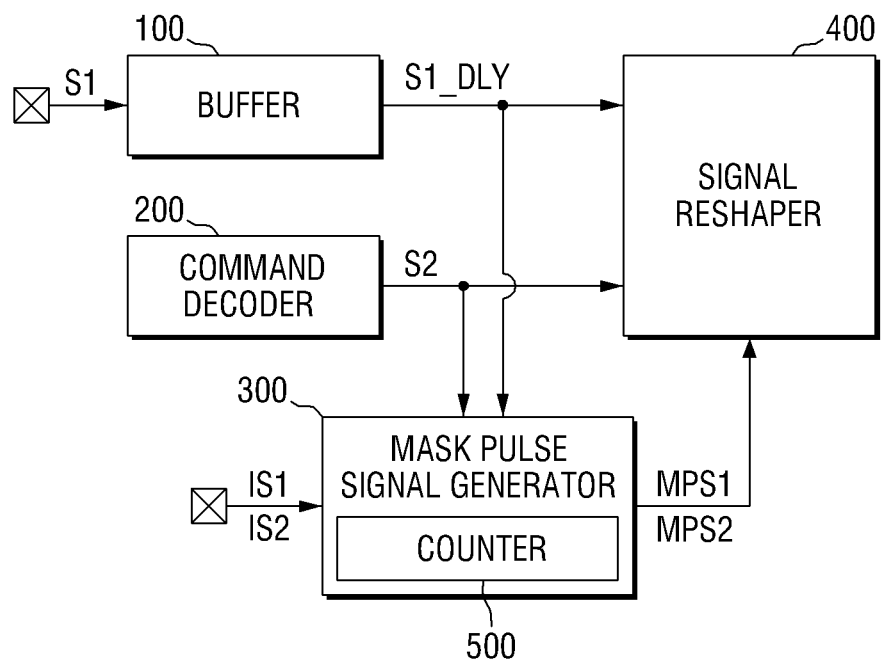
FIG. 7 is a block diagram which schematically illustrates a semiconductor memory device according to still another exemplary embodiment.

FIG. 7 is a block diagram schematically illustrating a semiconductor memory device according to still another embodiment of the present inventive concept. For the sake of convenient explanation, substantially the same portions as those of the semiconductor memory device according to the previous embodiment will be omitted.

Referring to FIG. 7, in the semiconductor memory device according to still another exemplary embodiment, a mask pulse signal generator 300 may further include a counter 500. The mask pulse signal generator 300 may include a first delay signal S1_DLY, a second signal S2, a first information signal IS1, and a second information signal IS2. The counter 500 may count the number of pulses of the first delay signal S1_DLY. Here, the first delay signal S1_DLY may be a data strobe signal DQS and the second signal S2 may be an internal write command signal. The counter 500 may generate mask pulse signals (e.g., MPS1 and MPS2) using information related to the number of pulses of the data strobe signal DQS, counted from a reference point. The reference point may be, for example, a point at which a first rising edge portion of the data strobe signal DQS and a pulse of the internal write command signal meet each other.

When the first rising edge of the data strobe signal DQS is moved at a timing which corresponds to the tDQSS min value of the internal write command signal IWC1, in successively performed write operations, the fourth rising edge of the data strobe signal DQS used in the previous write operation may fetch the internal write command signal IWC2 required for the next write operation. Therefore, in order to prevent the fourth rising edge of the data strobe signal DQS from fetching the internal write command signal IWC2 required in the next write operation, a pulse including the fourth rising edge of the data strobe signal DQS should be made into a low level. That is to say, the pulse containing the fourth rising edge of the data strobe signal DQS may be identified by counting from the reference point the number of pulses of the data strobe signal DQS.

In addition, when the first rising edge of the data strobe signal DQS is moved at a timing which corresponds to the tDQSS min value of the internal write command signal IWC1, the second rising edge of the data strobe signal DQS may fetch the internal write command signal IWC1. Therefore, in order to prevent the second rising edge of the data strobe signal DQS from fetching the internal write command signal IWC1, a pulse including the second rising edge of the data strobe signal DQS should be made into a low level. That is to say, the pulse containing the second rising edge of the data strobe signal DQS may be identified by counting from the reference point the number of pulses of the data strobe signal DQS.

As described above, if the pulses including the second and fourth rising edges of the data strobe signal DQS are known and are made into low levels, the internal write command signal may have a 2tCK margin, and a write fail may not be generated during a write operation.

Similarly, in a case where the internal write command signal needs to be reshaped to disable the internal write command signal, unnecessary pulses of the internal write command signal can be identified using the number of pulses of the data strobe signal DQS, counted by the counter 500, and the unnecessary pulses of the internal write command signal can be made into low levels.

Figure 8:
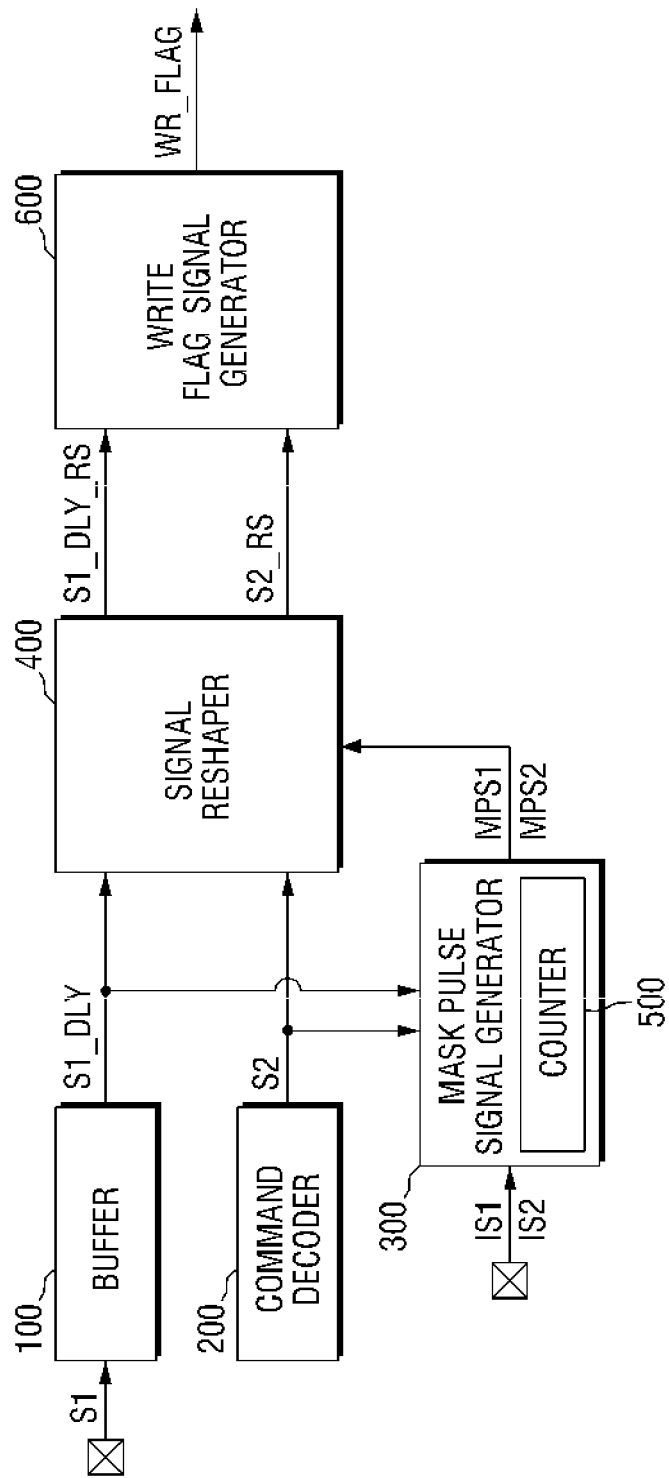
FIG. 8 is a block diagram schematically illustrating a semiconductor memory device according to still another exemplary embodiment.

FIG. 8 is a block diagram which schematically illustrates a semiconductor memory device according to still another exemplary embodiment. For the sake of convenient explanation, substantially the same portions as those of the semiconductor memory device according to the previous exemplary embodiment will be omitted.

Referring to FIG. 8, the semiconductor memory device according to still another exemplary embodiment may further include a write flag signal generator 600. The write flag signal generator 600 may generate a write flag signal WR_FLAG using a reshaped first delay signal S1_DLY_RS or a reshaped second signal S2_RS. The first delay signal S1_DLY may be a data strobe signal DQS and the second signal S2 may be an internal write command signal. A signal reshaper 400 may reshape the data strobe signal DQS or the internal write command signal, or may reshape both of the data strobe signal DQS and the internal write command signal. The write flag signal WR_FLAG may be generated using at least one of the reshaped data strobe signal and the reshaped internal write command signal. According to the above-described method of operating a semiconductor memory device, when the write flag signal WR_FLAG is generated, a fail associated with timing for generating the write flag signal WR_FLAG can be eliminated. Since the timing for generating the write flag signal WR_FLAG is related with the write fail, stability and accuracy in generating the write flag signal WR_FLAG are required.

Hereinafter, methods of operating semiconductor memory devices according to some exemplary embodiments will be described.

Figure 9:
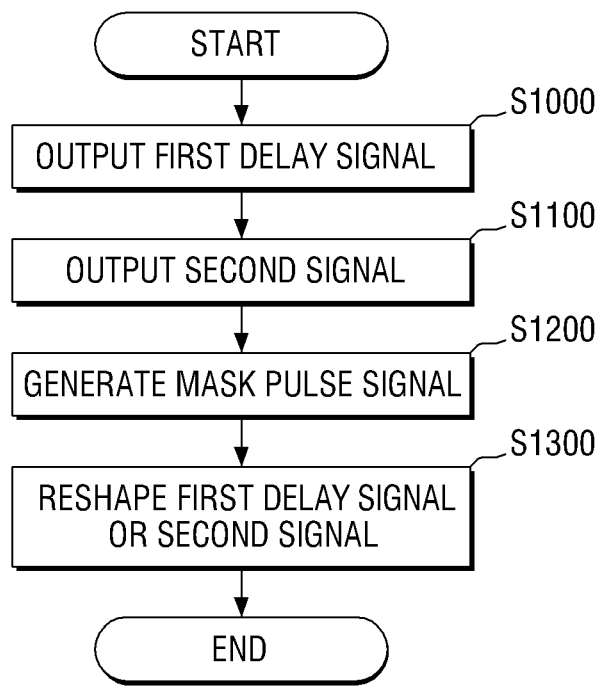
FIG. 9 is a flowchart which sequentially illustrates a method of operating a semiconductor memory device according to an exemplary embodiment.

FIG. 9 is a flowchart sequentially illustrating a method of operating a semiconductor memory device according to an exemplary embodiment.

Referring to FIG. 9, the method of operating the semiconductor memory device according to an exemplary embodiment may include receiving a first signal S1 and outputting a first delay signal S1_DLY (S1000). The first signal S1 may include a data strobe signal DQS for reading a data signal in a predetermined interval.

Next, a second signal S2 is output (S1100). The second signal S2 may include an internal write command signal for performing a write operation.

Next, mask pulse signals (e.g., MPS1 and MPS2) are generated using the first delay signal S1_DLY and the second signal S2 (S1200). The generating of the mask pulse signals (e.g., MPS1 and MPS2) may be performed using information related to the number of pulses of the first delay signal S1_DLY, counted from a reference point. The reference point may be a point at which a first rising edge portion of the first delay signal S1_DLY and a pulse of the second signal S2 meet each other. In addition to the first delay signal S1_DLY and the second signal S2, at least one of a first information signal IS1 and a second information signal IS2 may further be used in generating the mask pulse signals (e.g., MPS1 and MPS2).

Here, the first information signal IS1 may include information related to a preamble length of the first signal IS1, and the second information signal IS2 may include information related to generating position operations of the mask pulse signals (e.g., MPS1 and MPS2). For example, the first information signal IS1 may be a preamble information signal and the second information signal IS2 may be at least one of a cyclic redundancy check (CRC) information signal and a burst length information signal. Next, the first delay signal S1_DLY, the second signal S2, and the mask pulse signals (e.g., MPS1 and MPS2) are received and the first delay signal S1_DLY or the second signal S2 are reshaped (S1300).

The reshaping of the first delay signal S1_DLY may include reshaping first delay signal S1_DLY by combining the first delay signal S1_DLY and the mask pulse signal MPS1 to prevent the first delay signal S1_DLY from toggling. In addition, the reshaping of the second signal S2 may include reshaping the second signal S2 by combining the second signal S2 and the mask pulse signal MPS2 to disable the second signal S2.

Figure 10:
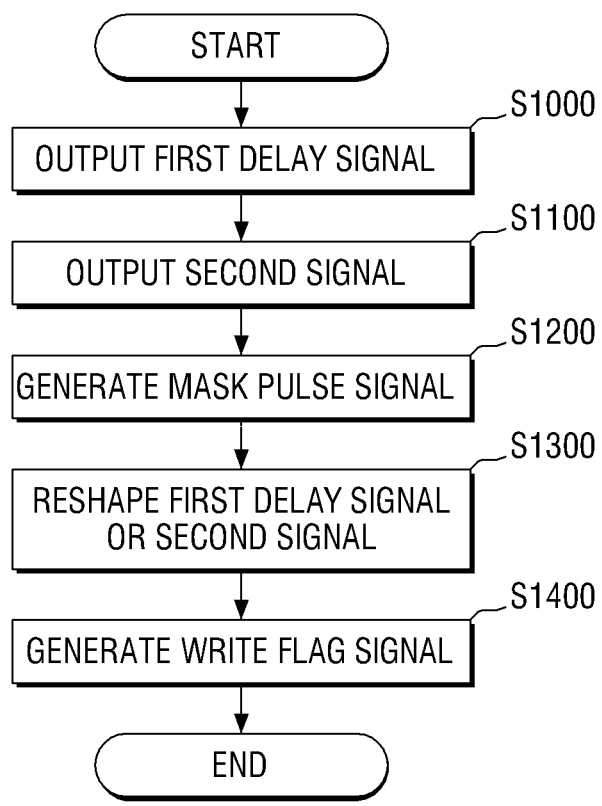
FIG. 10 is a flowchart which sequentially illustrates a method of operating a semiconductor memory device according to another exemplary embodiment.

FIG. 10 is a flowchart which sequentially illustrates a method of operating a semiconductor memory device according to another exemplary embodiment. For the sake of providing a clear explanation, substantially the same portions as those of the operating method of the semiconductor memory device according to the previous exemplary embodiment will be omitted.

Referring to FIG. 10, the method of operating a semiconductor memory device according to another exemplary embodiment may further include generating a write flag signal WR_FLAG using a reshaped first delay signal S1_DLY or a reshaped second signal S2 (S1400). Here, the first delay signal S1_DLY may be a data strobe signal DQS and the second signal S2 may be an internal write command signal. The data strobe signal DQS or the internal write command signal may be reshaped. Alternatively, both of the DQS data strobe signal and the internal write command signal may be reshaped. The write flag signal WR_FLAG may be generated using at least one of the reshaped data strobe signal and the reshaped internal write command signal.

Figure 11:
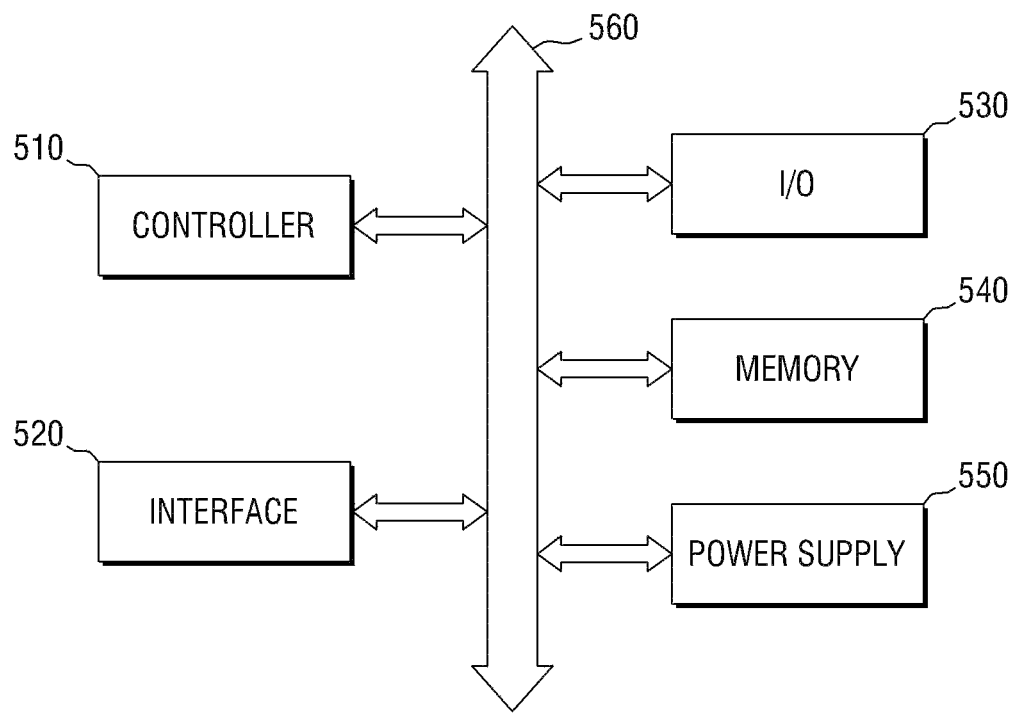
FIG. 11 is a schematic block diagram of an electronic system including a memory device according to exemplary embodiments.

Hereinafter, an electronic system including a memory device according to exemplary embodiments will be described. FIG. 11 is a schematic block diagram of an electronic system including a memory device according to further exemplary embodiments.

Referring to FIG. 11, the electronic system may include a controller 510, an interface 520, an input/output device (I/O) 530, a memory 540, a power supply 550, and a bus 560.

The controller 510, the interface 520, the I/O 530, the memory 540, and/or the power supply 550 may be connected to each other through the bus 560. The bus 560 may correspond to a pathway through which data moves.

The controller 510 may include at least one of a microprocessor, a digital signal processor, a microcontroller, and logic devices capable of performing similar functions to those performed by these devices.

The interface 520 may transmit/receive data to/from a communication network. The interface 520 may be wired or wireless. For example, the interface 540 may include an antenna or a wired/wireless transceiver.

The I/O 530, including a keypad, a keyboard, a display device, and the like, and may input/output data.

The memory 540 may store data and/or instructions. The semiconductor memory devices according to some exemplary embodiments may be provided as some components of the memory 540.

The power supply 550 may convert externally applied power to then supply the converted power to various components 510 to 540.

Figure 12:
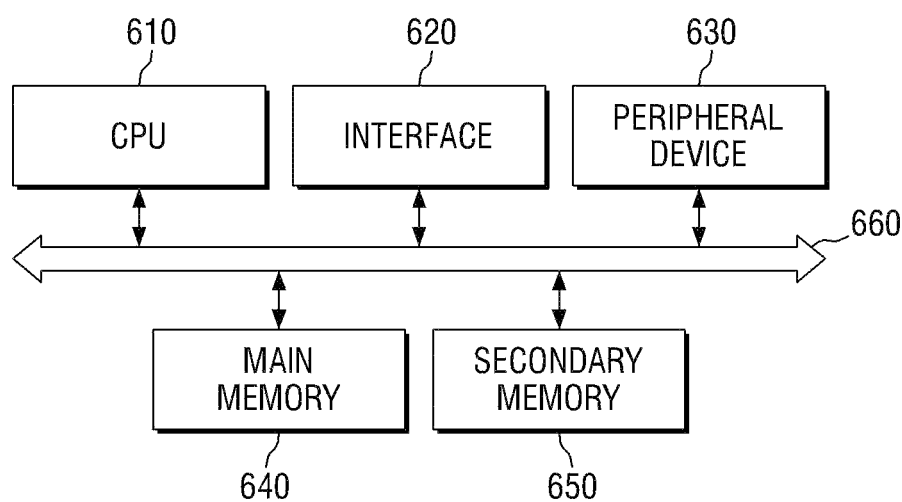
FIG. 12 is a schematic block diagram which illustrates an application example of an electronic system including a memory device according to exemplary embodiments.

FIG. 12 is a schematic block diagram illustrating an application example of an electronic system including a memory device according to embodiments of the present inventive concept.

Referring to FIG. 12, the electronic system may include a central processing unit (CPU) 610, an interface 620, a peripheral device 630, a main memory 640, a secondary memory 650 and a bus 660.

The CPU 610, the interface 620, the peripheral device 630, the main memory 640 and the secondary memory 650 may be connected to each other through the bus 660. The bus 660 corresponds to a pathway through which data moves.

The CPU 610, including a controller, an operation unit, and the like, may execute a program and may process data.

The interface 620 may transmit/receive data to/from a communication network. The interface 620 may be wired or wireless. For example, the interface 620 may include an antenna or a wired/wireless transceiver.

The peripheral device 630, including a mouse, a keyboard, a display, a printer, and the like, may input/output data.

The main memory 640 may transmit/receive data to/from the CPU 610 and may store data and/or commands required to execute a program. The semiconductor memory devices according to some exemplary embodiments may be provided as some components of the memory 640.

The secondary memory 650, including a nonvolatile memory, such as a magnetic tape, a magnetic disk, a floppy disk, a hard disk, an optical disk, and the like, may store data and/or commands. Even when power supply is interrupted, the secondary memory 650 may store data.

In various embodiments, the semiconductor memory devices according to some exemplary embodiments can be incorporated into a variety of different types of devices, such as computers, ultra mobile personal computers (UMPCs), work stations, net-books, personal digital assistants (PDAs), portable computers, web tablets, wireless phones, mobile phones, smart phones, e-books, portable multimedia players (PMPs), portable game consoles, navigation devices, black boxes, digital cameras, 3-dimensional televisions, digital audio recorders, digital audio players, digital video recorders, digital video players, devices capable of transmitting/receiving information in wireless environments, one of various electronic devices constituting a home network, one of various electronic devices constituting a computer network, one of various electronic devices constituting a telematics network, RFID devices, or computing systems.

While the present inventive concept has been particularly shown and described with reference to various exemplary embodiments, it will be understood by those of ordinary skill in the art that various changes in form and details may be made therein without departing from the spirit and scope of the present inventive concept as defined by the following claims. It is therefore desired that the exemplary embodiments be considered in all respects as illustrative and not restrictive, reference being made to the appended claims rather than the foregoing description.

What is claimed is:

1. A semiconductor memory device comprising:
 a buffer configured to input a first signal and outputs a first delay signal;
 a command decoder configured to output a second signal;
 a mask pulse signal generator configured to input the first delay signal and the second signal and generate a mask pulse signal; and
 a signal reshaper configured to input the first delay signal, the second signal and the mask pulse signal and reshape the first delay signal or the second signal,
 wherein the first signal includes a data strobe signal for fetching a data signal at a constant interval, and the second signal includes an internal write command signal for performing a write operation.

2. The semiconductor memory device of claim 1, wherein the mask pulse signal generator is further configured to input at least one of a first information signal which includes information related to a preamble length of the first signal and a second information signal which includes information related to an operation of generating a position of the mask pulse signal.

3. The semiconductor memory device of claim 2, wherein the first information signal is a preamble information signal and the second information signal is at least one of a cyclic redundancy check (CRC) information signal or a burst length information signal.

4. The semiconductor memory device of claim 1, wherein the mask pulse signal generator includes a counter that is configured to count the number of pulses of the first delay signal.

5. The semiconductor memory device of claim 4, wherein the mask pulse signal generator is configured to generate the mask pulse signal using information related to the number of pulses of the first delay signal, counted by the counter from a reference point.

6. The semiconductor memory device of claim 5, wherein the reference point is a point at which a first rising edge portion of the first delay signal and a pulse of the second signal meet.

7. The semiconductor memory device of claim 1, further comprising a write flag signal generator configured to generate a write flag signal using the reshaped first delay signal or the reshaped second signal.

8. The semiconductor memory device of claim 1, wherein the signal reshaper is configured to reshape the first delay signal in order to prevent the first delay signal from toggling or to disable the second signal.

9. A method of operating a semiconductor memory device, the method comprising:
 receiving a first signal and outputting a first delay signal;
 outputting a second signal from a command decoder;
 generating a mask pulse signal using the first delay signal and the second signal; and
 receiving the first delay signal, the second signal, and the mask pulse signal and reshaping the first delay signal or the second signal,
 wherein the first signal includes a data strobe signal for fetching a data signal at a constant interval, and the second signal includes an internal write command signal for performing a write operation.

10. The method of claim 9, wherein the generating of the mask pulse signal comprises generating the mask pulse signal using information related to the number of pulses of the first delay signal, counted from a reference point.

11. The method of claim 10, wherein the reference point is a point at which a first rising edge portion of the first delay signal and a pulse of the second signal meet.

12. The method of claim 11, wherein the reshaping of the first delay signal comprises synthesizing the first delay signal and the mask pulse signal in order to prevent the first delay signal from toggling.

13. The method of claim 11, wherein the reshaping of the first delay signal comprises synthesizing the first delay signal and the mask pulse signal to disable the second signal.

14. A semiconductor memory device comprising:
a mask pulse signal generator configured to receive a first delay signal and a second signal and generate a mask pulse signal; and
a signal reshaper configured to receive the first delay signal, the second signal and the mask pulse signal and reshape the first delay signal and the second signal.

15. The semiconductor memory device of claim 14, further comprising a buffer configured to input a first signal and outputs the first delay signal to the mask pulse signal generator.

16. The semiconductor memory device of claim 15, wherein the buffer is configured to output the first delay signal to the signal reshaper.

17. The semiconductor memory device of claim 14, further comprising a command decoder configured to output the second signal to the mask pulse signal generator.

* * * * *